US011308870B2

(12) United States Patent
Sung et al.

(10) Patent No.: US 11,308,870 B2
(45) Date of Patent: *Apr. 19, 2022

(54) ORGANIC LIGHT EMITTING DISPLAY DEVICE AND METHOD OF OPERATING THE SAME

(71) Applicant: Samsung Display Co., Ltd., Yongin-si (KR)

(72) Inventors: Jeongmin Sung, Seoul (KR); Woo-Chul Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/039,936

(22) Filed: Sep. 30, 2020

(65) Prior Publication Data

US 2021/0020099 A1 Jan. 21, 2021

Related U.S. Application Data

(63) Continuation of application No. 15/943,325, filed on Apr. 2, 2018, now Pat. No. 10,796,632.

(30) Foreign Application Priority Data

May 24, 2017 (KR) ........................ 10-2017-0064245

(51) Int. Cl.
*G09G 3/3208* (2016.01)
*H01L 27/32* (2006.01)
*G09G 5/00* (2006.01)

(52) U.S. Cl.
CPC ........... *G09G 3/3208* (2013.01); *G09G 5/003* (2013.01); *H01L 27/32* (2013.01);
(Continued)

(58) Field of Classification Search
None
See application file for complete search history.

(56) References Cited

U.S. PATENT DOCUMENTS 9,870,731 B2 * 1/2018 Jiang .................... G09G 3/3208
2007/0222718 A1 9/2007 Takahara
(Continued)

FOREIGN PATENT DOCUMENTS

JP 2004-325940 A 11/2004
JP 2006-30289 A 2/2006
KR 10-2007-0083199 A 8/2007

OTHER PUBLICATIONS

Korean Notice of Allowance dated Nov. 28, 2021, issued in Korean Patent Application No. 10-2017-0064245 (5 pages).

*Primary Examiner* — Christopher J Kohlman
(74) *Attorney, Agent, or Firm* — Lewis Roca Rothgerber Christie LLP

(57) ABSTRACT

An organic light emitting display device comprising: a source device configured to output image data; and a sink device configured to perform a displaying operation based on the image data, wherein the source device is configured to change a frame rate of an image frame composing the image data while the displaying operation is performed, wherein the sink device is configured to change a frame rate of a panel driving frame for the displaying operation as the frame rate of the image frame is changed, and wherein the source device is configured to change the frame rate of the image frame while satisfying a condition in which an emission duty ratio of the panel driving frame is not changed.

20 Claims, 9 Drawing Sheets

(52) U.S. Cl.
CPC ............... *G09G 2300/0814* (2013.01); *G09G 2300/0819* (2013.01); *G09G 2300/0842* (2013.01); *G09G 2300/0861* (2013.01); *G09G 2310/0264* (2013.01); *G09G 2340/04* (2013.01); *G09G 2340/0435* (2013.01); *G09G 2340/0442* (2013.01)

(56) References Cited

U.S. PATENT DOCUMENTS

| | | | | |
|---|---|---|---|---|
| 2014/0375703 | A1 | 12/2014 | Ban et al. | |
| 2016/0196802 | A1 | 7/2016 | Nho et al. | |
| 2018/0151109 | A1 * | 5/2018 | Shim | G09G 3/32 |

* cited by examiner

ORGANIC LIGHT EMITTING DISPLAY DEVICE AND METHOD OF OPERATING THE SAME

CROSS-REFERENCE TO RELATED APPLICATIONS

This application is a continuation of U.S. patent application Ser. No. 15/943,325, filed Apr. 2, 2018, which claims priority to and the benefit of Korean Patent Application No. 10-2017-0064245, filed May 24, 2017, the entire content of both of which is incorporated herein by reference.

BACKGROUND

1. Field

Aspects of some example embodiments relate generally to a display device.

2. Description of the Related Art

Generally, a display device includes a source device and a sink device. Here, the source device (e.g., graphic processing unit (GPU)) transmits image data to the sink device, and the sink device performs a displaying operation based on the image data transmitted from the source device. A related art display device may change a frame rate of an image frame composing the image data (or, a time (or, length) of the image frame) in real time according to characteristics of images that are displayed while the displaying operation is performed. For example, the source device may increase the frame rate of the image frame transmitted to the sink device (e.g., decreases the time of the image frame) when a change of the images displayed by the displaying operation is relatively fast. On the other hand, the source device may decrease the frame rate of the image frame transmitted to the sink device (e.g., increases the time of the image frame) when a change of the images displayed by the displaying operation is relatively slow. Here, if a frame rate of a panel driving frame for the displaying operation is not changed, the frame rate of the image frame may not be consistent with the frame rate of the panel driving frame, so that a phenomenon such as a tearing, a stuttering, etc. may occur in images that the sink device displays. Thus, a synchronization technology that changes the frame rate of the panel driving frame as the frame rate of the image frame is changed and synchronizes a driving timing of the panel driving frame with a transmitting timing of the image frame may be utilized. However, it may be difficult to apply related art synchronization technology to an organic light emitting display device that employs an impulse driving method by which a self-luminous element (e.g., an organic light emitting diode, etc.) emits light in response to an emission on-off clock. For example, if related art synchronization technology is applied to the organic light emitting display device that employs the impulse driving method, an emission duty ratio may differ for each panel driving frame, so that a flicker that a user (or, viewer) can perceive may occur.

The above information disclosed in this Background section is only for enhancement of understanding of the background of the invention and therefore it may contain information that does not form prior art.

SUMMARY

Aspects of some example embodiments relate generally to a display device. Some example embodiments of the present invention relate to an organic light emitting display device that employs an impulse driving method and a method of operating the organic light emitting display device.

Some example embodiments include an organic light emitting display device capable of preventing or reducing a flicker that a viewer can perceive from occurring by maintaining an emission duty ratio to be constant for each panel driving frame when a frame rate of a panel driving frame is changed as a frame rate of an image frame (or, a time of the image frame) is changed and when a driving timing of the panel driving frame is synchronized with a transmitting timing of the image frame.

According to some example embodiments, an organic light emitting display device may include a source device configured to output image data and a sink device configured to perform a displaying operation based on the image data. The source device may change a frame rate of an image frame composing the image data while the displaying operation is performed. The sink device may change a frame rate of a panel driving frame for the displaying operation as the frame rate of the image frame is changed. Here, the source device may change the frame rate of the image frame while satisfying a condition in which an emission duty ratio of the panel driving frame is not changed.

In some example embodiments, the sink device may include a pixel circuit that includes an organic light emitting diode. In addition, the organic light emitting diode may emit light in response to an emission on-off clock.

In some example embodiments, one clock cycle time of the emission on-off clock may not be changed when the frame rate of the image frame and the frame rate of the panel driving frame are changed.

In some example embodiments, the source device may change the frame rate of the image frame to control a time of the image frame to be equal to or longer than the one clock cycle time of the emission on-off clock.

In some example embodiments, the source device may change the frame rate of the image frame to control the time of the image frame to be an integer multiple of the one clock cycle time of the emission on-off clock.

In some example embodiments, the sink device may increase the frame rate of the panel driving frame as the source device increases the frame rate of the image frame.

In some example embodiments, the sink device may decrease the frame rate of the panel driving frame as the source device decreases the frame rate of the image frame.

In some example embodiments, the sink device may change the frame rate of the panel driving frame to be equal to the frame rate of the image frame.

In some example embodiments, the source device may change the frame rate of the image frame according to characteristics of images that are displayed by the displaying operation.

In some example embodiments, the source device may increase the frame rate of the image frame when a change of the images is faster than a predetermined reference speed.

In some example embodiments, the source device may decrease the frame rate of the image frame when a change of the images is slower than a predetermined reference speed.

According to some example embodiments, an organic light emitting display device may include a source device configured to output image data and a sink device configured to perform a displaying operation based on the image data. The source device may change a frame rate of an image frame composing the image data while the displaying operation is performed. The sink device may change a frame rate of a panel driving frame for the displaying operation as the frame rate of the image frame is changed. Here, the source device changes the frame rate of the image frame using Equation 1:

$$F = \frac{1}{A \times K},$$

where F denotes the frame rate of the image frame, A denotes one clock cycle time of an emission on-off clock, and K is an integer greater than or equal to 1.

In some example embodiments, the source device may change the frame rate of the image frame by selecting one of a plurality of candidate frame rates of the image frame that are calculated by the [Equation 1] as the frame rate of the image frame.

In some example embodiments, the sink device may include a pixel circuit that includes an organic light emitting diode. In addition, the organic light emitting diode may emit light in response to the emission on-off clock. Furthermore, the one clock cycle time of the emission on-off clock may not be changed when the frame rate of the image frame and the frame rate of the panel driving frame are changed.

In some example embodiments, the sink device may increase the frame rate of the panel driving frame as the source device increases the frame rate of the image frame.

In some example embodiments, the sink device may decrease the frame rate of the panel driving frame as the source device decreases the frame rate of the image frame.

In some example embodiments, the sink device may change the frame rate of the panel driving frame to be equal to the frame rate of the image frame.

In some example embodiments, the source device may change the frame rate of the image frame according to characteristics of images that are displayed by the displaying operation.

In some example embodiments, the source device may increase the frame rate of the image frame when a change of the images is faster than a predetermined reference speed.

In some example embodiments, the source device may decrease the frame rate of the image frame when a change of the images is slower than a predetermined reference speed.

Therefore, an organic light emitting display device according to some example embodiments, where the organic light emitting display device employs an impulse driving method by which an organic light emitting diode included in a pixel circuit emits light in response to an emission on-off clock, may change a frame rate of an image frame composing image data (or, a time of the image frame) while satisfying a condition in which an emission duty ratio of a panel driving frame is not changed when the organic light emitting display device changes the frame rate of the image frame during a displaying operation by which images are displayed. Thus, the organic light emitting display device may prevent or reduce a flicker that a viewer can perceive from occurring by maintaining an emission duty ratio to be constant for each panel driving frame when a frame rate of the panel driving frame is changed as the frame rate of the image frame is changed and when a driving timing of the panel driving frame is synchronized with a transmitting timing of the image frame.

BRIEF DESCRIPTION OF THE DRAWINGS

Illustrative, non-limiting example embodiments will be more clearly understood from the following detailed description in conjunction with the accompanying drawings.

DETAILED DESCRIPTION

Hereinafter, aspects of some example embodiments of the present invention will be explained in more detail with reference to the accompanying drawings.

Figure 1:
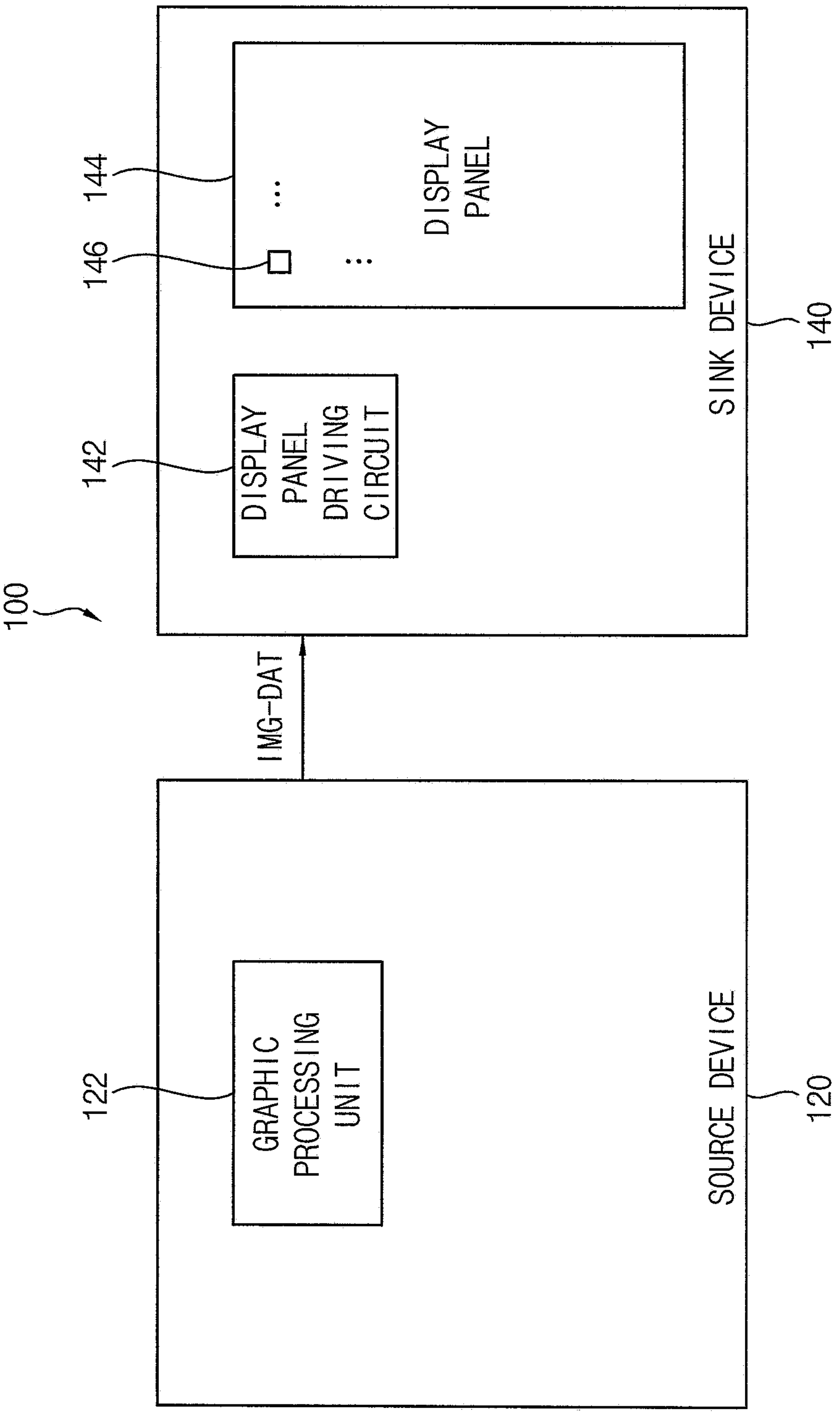
FIG. 1 is a block diagram illustrating an organic light emitting display device according to some example embodiments.
Figure 2:
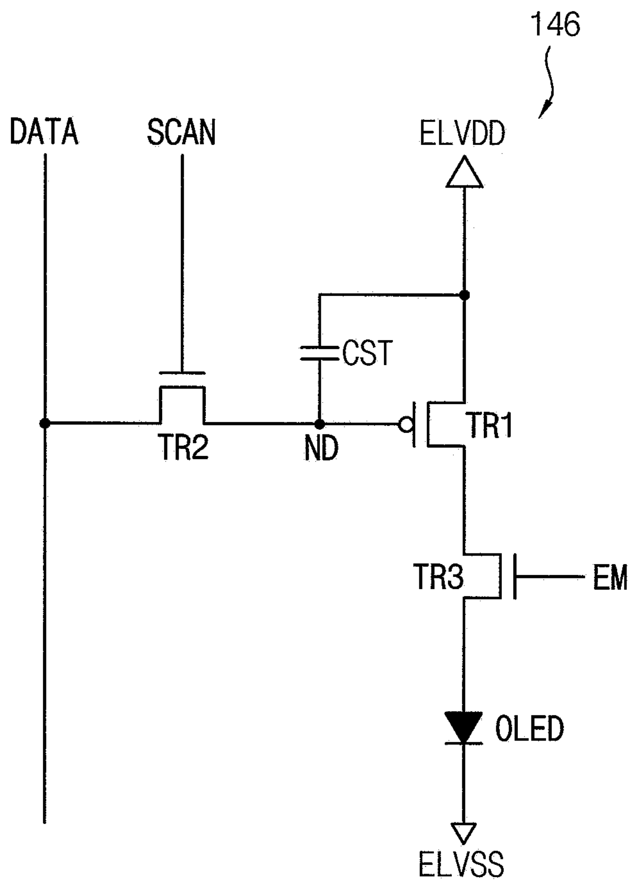
FIG. 2 is a circuit diagram illustrating an example of a pixel circuit included in the organic light emitting display device of FIG. 1.
Figure 3:
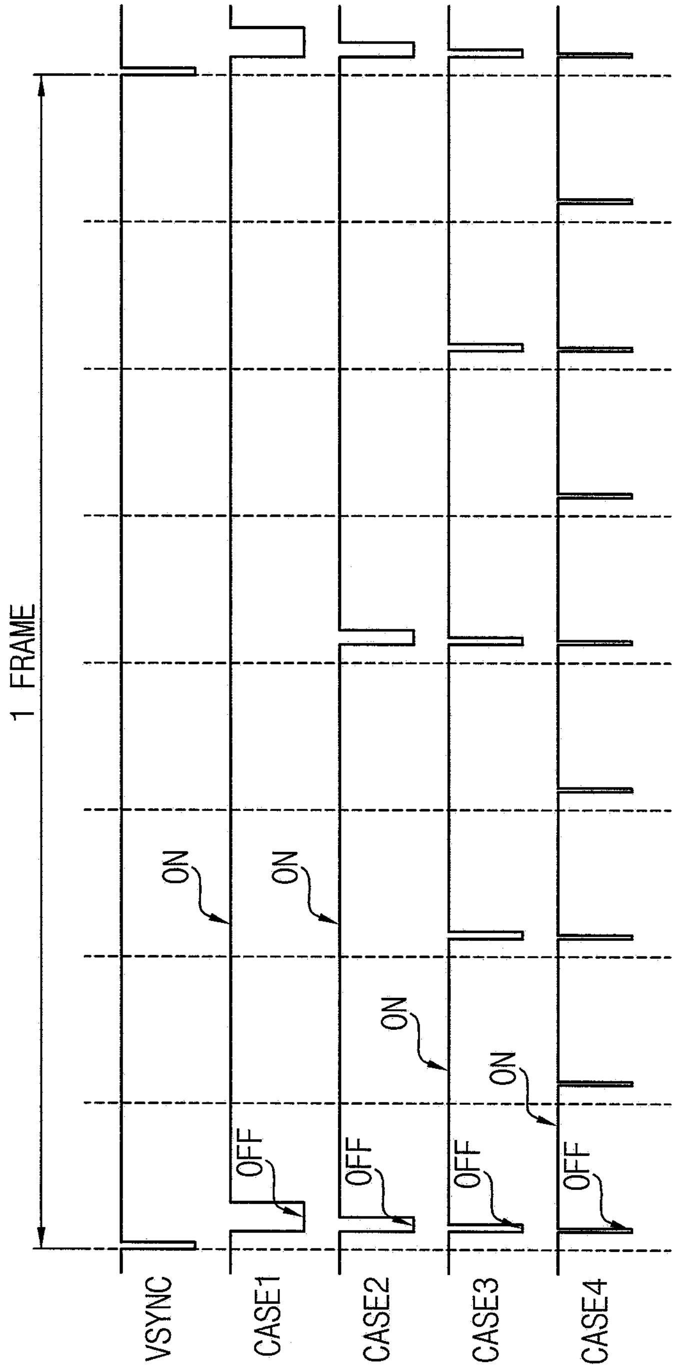
FIG. 3 is a timing diagram for describing that the organic light emitting display device of FIG. 1 is driven by an impulse driving method.

FIG. 1 is a block diagram illustrating an organic light emitting display device according to some example embodiments. FIG. 2 is a circuit diagram illustrating an example of a pixel circuit included in the organic light emitting display device of FIG. 1. FIG. 3 is a timing diagram for describing that the organic light emitting display device of FIG. 1 is driven by an impulse driving method.

Referring to FIGS. 1 to 3, the organic light emitting display device 100 may include a source device 120 and a sink device 140. Here, the source device 120 and the sink device 140 may perform data communication using a specific interface. For example, the source device 120 may transmit image data IMG-DAT to the sink device 140 using an embedded display port (eDP) interface. However, an interface between the source device 120 and the sink device 140 is not limited thereto.

The organic light emitting display device 100 may employ an impulse driving method by which an organic light emitting diode OLED included in a pixel circuit 146 emits light in response to an emission on-off clock EM. For example, as illustrated in FIG. 2, the pixel circuit 146 included in the organic light emitting display device 100 may include a driving transistor TR1, a switching transistor TR2, an emission control transistor TR3, a storage capacitor CST, and the organic light emitting diode OLED. The driving transistor TR1 may be connected between a high power voltage ELVDD and the emission control transistor TR3. The switching transistor TR2 may be connected between a data line and a driving node ND. The emission control transistor TR3 may be connected between the driving transistor TR1 and the organic light emitting diode OLED. The storage capacitor CST may be connected between the high power voltage ELVDD and the driving node ND. The organic light emitting diode OLED may be connected between the emission control transistor TR3 and a low power voltage ELVSS. A data voltage DATA corresponding to the image data IMG-DAT may be stored in the storage capacitor CST when the switching transistor TR2 is turned on in response to a scan signal SCAN. A current may flow through the organic light emitting diode OLED when the emission control transistor TR3 is turned on in response to the emission on-off clock EM. Thus, the pixel circuit 146 (e.g., the organic light emitting diode OLED) may emit light based on the current. Here, the current may be adjusted by the driving transistor TR1 based on the data voltage DATA stored in the storage capacitor CST. However, because the above structure of the pixel circuit 146 is an example, it should be understood that the pixel circuit 146 of the organic light emitting display device 100 is not limited thereto.

As illustrated in FIG. 3, the organic light emitting display device 100 may control the pixel circuit 146 to emit light one or more times using the emission on-off clock EM during one panel driving frame (e.g., indicated by 1 FRAME) that is defined by a vertical synchronization signal VSYNC. The emission control transistor TR3 of the pixel circuit 146 may be turned on in an on-period ON of the emission on-off clock EM, and thus the pixel circuit 146 may emit light. The emission control transistor TR3 of the pixel circuit 146 may be turned off in an off-period OFF of the emission on-off clock EM, and thus the pixel circuit 146 may not emit light. Thus, from a first case CASE1 to a fourth case CASE4, the number of times the pixel circuit 146 emits light during one panel driving frame may increase because the number of the on-periods ON of the emission on-off clock EM belonging to the panel driving frame increases. However, from the first case CASE1 to the fourth case CASE4, one emission duration time during which the pixel circuit 146 emits light may decrease in one panel driving frame because a length (e.g., time) of respective on-periods ON of the emission on-off clock EM belonging to the panel driving frame decreases. Nevertheless, because a total length of the on-periods ON belonging to one panel driving frame is the same in all cases CASE1 through CASE4, luminance of the pixel circuit 146 may be the same in all cases CASE1 through CASE4 when the same data voltage DATA is applied to the pixel circuit 146. In FIG. 3, one panel driving frame is illustrated with respect to one horizontal line of the display panel 144 included in the sink device 140. In other words, because each of the scan signal SCAN and the emission on-off clock EM is sequentially applied to the horizontal lines (e.g., the scan lines or the emission control lines) of the display panel 144, it should be understood that one panel driving frame is sequentially shifted for each of the horizontal lines of the display panel 144.

The source device 120 may output the image data IMG-DAT input from an external component to the sink device 140. For this operation, the source device 120 may include a graphic processing unit 122. The graphic processing unit 122 may perform a specific processing on the image data IMG-DAT. Recently, a display device changes a frame rate of the image frame composing the image data IMG-DAT according to characteristics of images that are displayed while a displaying operation is performed. Here, when a frame rate of the panel driving frame is not changed, the frame rate of the image frame may not be consistent with the frame rate of the panel driving frame, so that a phenomenon such as a tearing, a stuttering, etc. may occur in the images that the sink device 140 displays. Thus, the organic light emitting display device 100 may change the frame rate of the panel driving frame as the frame rate of the image frame is changed and may synchronize a driving timing of the panel driving frame with a transmitting timing of the image frame while controlling the organic light emitting diode OLED of the pixel circuit 146 to emit light in response to the emission on-off clock EM (e.g., employing the impulse driving method). For example, the source device 120 may change the frame rate of the image frame composing the image data IMG-DAT in real time when the displaying operation is performed. Here, the source device 120 may change the frame rate of the image frame while satisfying a condition in which an emission duty ratio of the panel driving frame is not changed. In some example embodiments, the source device 120 may change the frame rate of the image frame according to characteristics of the images displayed by the displaying operation. For example, the source device 120 may increase the frame rate of the image frame when a change of the images displayed by the displaying operation is faster than a predetermined reference speed (e.g., a fast-moving video, etc.). On the other hand, the source device 120 may decrease the frame rate of the image frame when a change of the images displayed by the displaying operation is slower than a predetermined reference speed (e.g., a slow-moving video, etc.). Although it is illustrated in FIG. 1 that the source device 120 includes only the graphic processing unit 122, it should be understood that the source device 120 can further include other components (e.g., a processor, a frame buffer memory, a transmitting circuit, etc.).

In some example embodiments, the source device 120 may change the frame rate of the image frame using [Equation 1]:

$$F = \frac{1}{A \times K},$$

where F denotes the frame rate of the image frame, where the unit of F is hertz (Hz), A denotes one clock cycle time of the emission on-off clock EM, where the unit of A is second (sec), and K is an integer greater than or equal to 1.

As shown in the [Equation 1], the frame rate of the image frame may be calculated as an inverse number of a value generated by multiplying one clock cycle time A of the emission on-off clock EM by the integer K. Here, because the frame rate of the image frame is inversely proportional to a time of the image frame, according to the [Equation 1], the time of the image frame may be proportional to the value generated by multiplying one clock cycle time A by the integer K. In other words, the frame rate of the image frame is changed to control the time of the image frame to be equal to or longer than one clock cycle time A of the emission on-off clock EM. For example, the frame rate of the image frame may be changed to control the time of the image frame to be an integer multiple of one clock cycle time A of the emission on-off clock EM. As described above, because the source device 120 changes the frame rate of the image frame using the [Equation 1], the source device 120 may change the frame rate of the image frame while satisfying the condition in which the emission duty ratio of the panel driving frame is not changed. In some example embodiments, when the source device 120 changes the frame rate of the image frame in real time while the displaying operation is performed, the source device 120 may calculate candidate frame rates of the image frame using the [Equation 1] and may select one of the candidate frame rates of the image frame as the frame rate of the image frame. In this manner, the source device 120 may change the frame rate of the image frame while satisfying the condition in which the emission duty ratio of the panel driving frame is not changed.

The sink device 140 may perform the displaying operation based on the image data IMG-DAT output from the source device 120. For this operation, the sink device 140 may include a display panel driving circuit 142 and the display panel 144. As described above, the display panel 144 may include a plurality of pixel circuits 146, and each of the pixel circuits 146 may include the organic light emitting diode OLED. The display panel driving circuit 142 may receive the image data IMG-DAT output from the source device 120 and may display the images on the display panel 144 based on the image data IMG-DAT. The display panel driving circuit 142 may include a scan driver that provides the scan signal SCAN to the display panel 144, a data driver that provides a data signal (e.g., the data voltage DATA) to the display panel 144, a timing controller that controls the scan driver and the data driver, etc. However, components included in the display panel driving circuit 142 are not limited thereto. Meanwhile, the sink device 140 may change the frame rate of the panel driving frame as the frame rate of the image frame is changed. For example, the sink device 140 may increase the frame rate of the panel driving frame as the source device 120 increases the frame rate of the image frame. On the other hand, the sink device 140 may decrease the frame rate of the panel driving frame as the source device 120 decreases the frame rate of the image frame. In some example embodiments, the sink device 140 may change the frame rate of the panel driving frame to have the same value as the frame rate of the image frame. Although it is illustrated in FIG. 1 that the sink device 140 includes the display panel driving circuit 142 and the display panel 144, it should be understood that the sink device 140 can further include other components (e.g., a processor, a frame buffer memory, a receiving circuit, etc.).

As described above, because the frame rate (e.g., Hz) of the image frame is inversely proportional to the time (e.g., sec) of the image frame, the time of the image frame may be decreased as the frame rate of the image frame is increased, and the time of the image frame may be increased as the frame rate of the image frame is decreased. Similarly, because the frame rate of the panel driving frame is inversely proportional to the time of the panel driving frame, the time of the panel driving frame may be decreased as the frame rate of the panel driving frame is increased, and the time of the panel driving frame may be increased as the frame rate of the panel driving frame is decreased. Although the frame rate of the panel driving frame (or, the time of the panel driving frame) is changed as the frame rate of the image frame (or, the time of the image frame) is changed, the organic light emitting display device 100 may not change one clock cycle time of the emission on-off clock EM. In other words, one clock cycle time of the emission on-off clock EM may be maintained to be constant, regardless of the frame rate of the image frame and the frame rate of the panel driving frame. Nevertheless, the organic light emitting display device 100 may maintain the emission duty ratio of the panel driving frame to be constant. To this end, the source device 120 may change the frame rate of the image frame to control the time of the image frame to be equal to or longer than one clock cycle time of the emission on-off clock EM. In some example embodiments, the source device 120 may change the frame rate of the image frame to control the time of the image frame to be an integer multiple of one clock cycle time of the emission on-off clock EM. Thus, the number of clock cycles belonging to the panel driving frame may be proportionally decreased when the time of the panel driving frame is decreased as the frame rate of the panel driving frame is increased (e.g., when the frame rate of the panel driving frame is increased as the frame rate of the image frame is increased). As a result, the emission duty ratio of the panel driving frame may be maintained to be constant. Similarly, the number of clock cycles belonging to the panel driving frame may be proportionally increased when the time of the panel driving frame is increased as the frame rate of the panel driving frame is decreased (e.g., when the frame rate of the panel driving frame is decreased as the frame rate of the image frame is decreased). As a result, the emission duty ratio of the panel driving frame may be maintained to be constant.

In brief, the organic light emitting display device 100 may employ the impulse driving method by which the organic light emitting diode OLED included in the pixel circuit 146 emits light in response to the emission on-off clock EM. Here, the organic light emitting display device 100 may change the frame rate of the image frame composing the image data IMG-DAT (or, the time of the image frame) while satisfying the condition in which the emission duty ratio of the panel driving frame is not changed when the organic light emitting display device 100 changes the frame rate of the image frame during the displaying operation by which the images are displayed. Thus, the organic light emitting display device 100 may prevent or reduce a flicker that a viewer can perceive from occurring by maintaining the emission duty ratio to be constant for each panel driving frame when the frame rate of the panel driving frame is changed as the frame rate of the image frame is changed and when the driving timing of the panel driving frame is synchronized with the transmitting timing of the image frame. As a result, the organic light emitting display device 100 may provide a high-quality image to the viewer.

Figure 4:
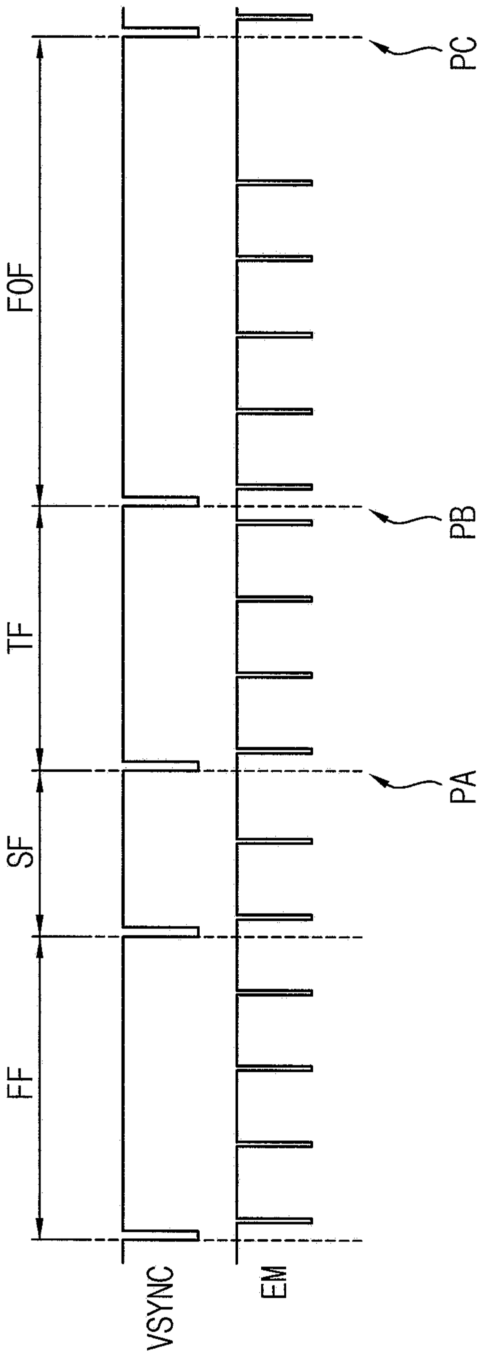
FIG. 4 is a timing diagram for describing that an emission duty ratio is changed for each panel driving frame in an organic light emitting display device to which a related art synchronization technology is applied.
Figure 5:
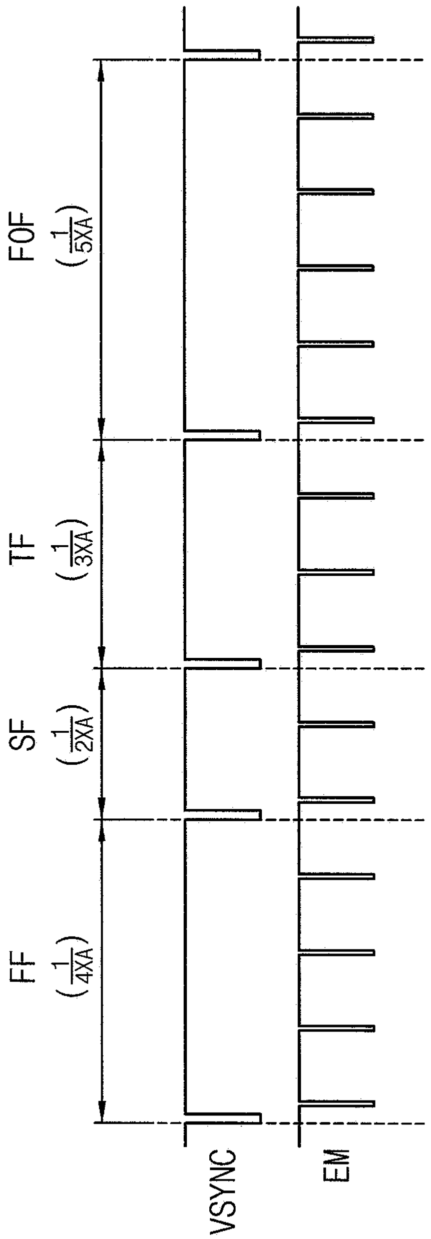
FIG. 5 is a timing diagram for describing that an emission duty ratio is maintained to be constant for each panel driving frame in the organic light emitting display device of FIG. 1.

FIG. 4 is a timing diagram for describing that an emission duty ratio is changed for each panel driving frame in an organic light emitting display device to which a related art synchronization technology is applied. FIG. 5 is a timing diagram for describing that an emission duty ratio is maintained to be constant for each panel driving frame in the organic light emitting display device of FIG. 1.

Referring to FIGS. 4 and 5, the sink device 140 may change a frame rate of a panel driving frame for a displaying operation as the source device 120 changes a frame rate of an image frame FF, SF, TF, and FOF composing image data IMG-DAT while the displaying operation is performed.

For example, as illustrated in FIG. 4, the organic light emitting display device to which the related art synchronization technology is applied may arbitrarily change the frame rate of the image frame FF, SF, TF, and FOF composing the image data IMG-DAT and may synchronize a driving timing of the panel driving frame with a transmitting timing of the image frame FF, SF, TF, and FOF. Thus, an emission duty ratio for each panel driving frame synchronized with each image frame FF, SF, TF, and FOF may be changed in the organic light emitting display device to which the related art synchronization technology. For example, as illustrated in FIG. 4, when the first image frame FF has a frame rate of the reference image frame, the second image frame SF may have a frame rate that is greater than the frame rate of the first image frame FF as the frame rate of the image frame FF, SF, TF, and FOF composing the image data IMG-DAT is changed. Thus, the last clock cycle of the emission on-off clock EM belonging to the second image frame SF may be increased (or, lengthened) (e.g., indicated by PA), so that the flicker that the viewer can perceive may occur because the emission duty ratio of the second image frame SF is changed. In addition, the third image frame TF may have a frame rate that is smaller than the frame rate of the second image frame SF as the frame rate of the image frame FF, SF, TF, and FOF composing the image data IMG-DAT is changed. Thus, the last clock cycle of the emission on-off clock EM belonging to the third image frame TF may be decreased (or, shortened) (e.g., indicated by PB), so that the flicker that the viewer can perceive may occur because the emission duty ratio of the third image frame TF is changed. Furthermore, the fourth image frame FOF may have a frame rate that is smaller than the frame rate of the third image frame TF as the frame rate of the image frame FF, SF, TF, and FOF composing the image data IMG-DAT is changed. Thus, the last clock cycle of the emission on-off clock EM belonging to the fourth image frame FOF may be increased (e.g., indicated by PC), so that the flicker that the viewer can perceive may occur because the emission duty ratio of the fourth image frame FOF is changed.

On the other hand, as illustrated in FIG. 5, the organic light emitting display device 100 may change the frame rate of the image frame FF, SF, TF, and FOF composing the image data IMG-DAT to control the time of the image frame FF, SF, TF, and FOF to be an integer multiple of one clock cycle time of the emission on-off clock EM. Thus, although the driving timing of the panel driving frame is synchronized with the transmitting timing of the image frame FF, SF, TF, and FOF, the emission duty ratio of each panel driving frame synchronized with each image frame FF, SF, TF, and FOF may be maintained to be constant (e.g., may not be changed). For example, as illustrated in FIG. 5, when the first image frame FF has a frame rate of the reference image frame (e.g., 1/(4×A)), the second image frame SF may have a frame rate (e.g., 1/(2×A)) that is greater than the frame rate of the first image frame FF as the frame rate of the image frame FF, SF, TF, and FOF composing the image data IMG-DAT is changed. Here, because the frame rate of the image frame FF, SF, TF, and FOF composing the image data IMG-DAT is changed while satisfying the condition in which the emission duty ratio of the panel driving frame is not changed (e.g., the frame rate of the image frame FF, SF, TF, and FOF is changed to control the time of the image frame FF, SF, TF, and FOF to be an integer multiple of one clock cycle time of the emission on-off clock EM), the last clock cycle of the emission on-off clock EM belonging to the second image frame SF may not be changed, so that the emission duty ratio of the second image frame SF may be maintained to be constant. Thus, the flicker that the viewer can perceive may not occur. In addition, the third image frame TF may have a frame rate (e.g., 1/(3×A)) that is smaller than the frame rate of the second image frame SF as the frame rate of the image frame FF, SF, TF, and FOF composing the image data IMG-DAT is changed. Here, because the frame rate of the image frame FF, SF, TF, and FOF composing the image data IMG-DAT is changed while satisfying the condition in which the emission duty ratio of the panel driving frame is not changed, the last clock cycle of the emission on-off clock EM belonging to the third image frame TF may not be changed, so that the emission duty ratio of the third image frame TF may be maintained to be constant. Thus, the flicker that the viewer can perceive may not occur.

Furthermore, the fourth image frame FOF may have a frame rate (e.g., 1/(5×A)) that is smaller than the frame rate of the third image frame TF as the frame rate of the image frame FF, SF, TF, and FOF composing the image data IMG-DAT is changed. Here, because the frame rate of the image frame FF, SF, TF, and FOF composing the image data IMG-DAT is changed while satisfying the condition in which the emission duty ratio of the panel driving frame is not changed, the last clock cycle of the emission on-off clock EM belonging to the fourth image frame FOF may not be changed, so that the emission duty ratio of the fourth image frame FOF may be maintained to be constant. Thus, the flicker that the viewer can perceive may not occur. In brief, the organic light emitting display device 100 may change the frame rate of the image frame FF, SF, TF, and FOF composing the image data IMG-DAT (or, the time of the image frame FF, SF, TF, and FOF) while satisfying the condition in which the emission duty ratio of the panel driving frame is not changed. Thus, the organic light emitting display device 100 may prevent or reduce the flicker that the viewer can perceive from occurring by maintaining the emission duty ratio to be constant for each panel driving frame when the frame rate of the panel driving frame is changed as the frame rate of the image frame FF, SF, TF, and FOF is changed and when the driving timing of the panel driving frame is synchronized with the transmitting timing of the image frame FF, SF, TF, and FOF. As a result, the organic light emitting display device 100 may provide a high-quality image to the viewer.

Figure 6:
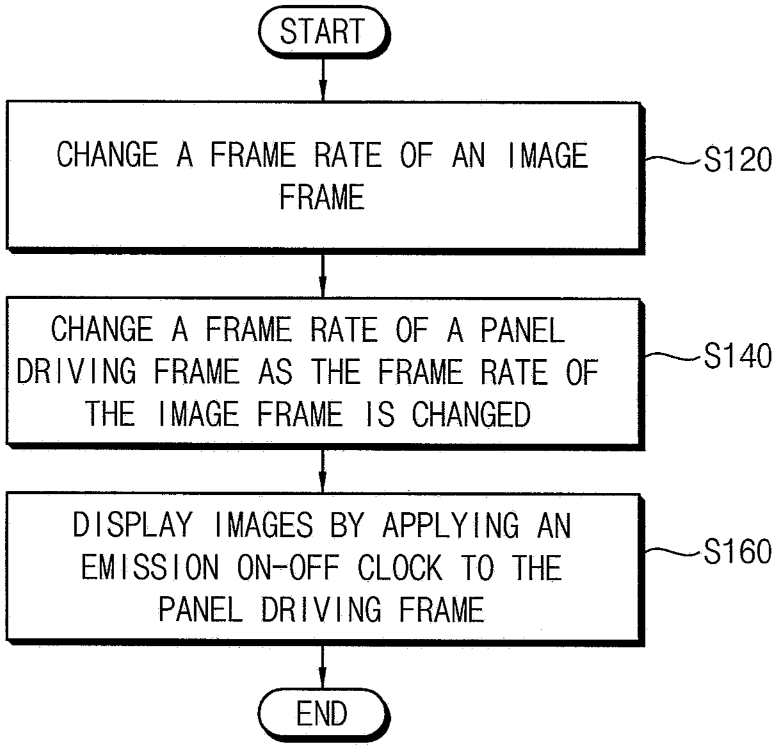
FIG. 6 is a flow chart illustrating a method of operating an organic light emitting display device according to some example embodiments.
Figure 7:
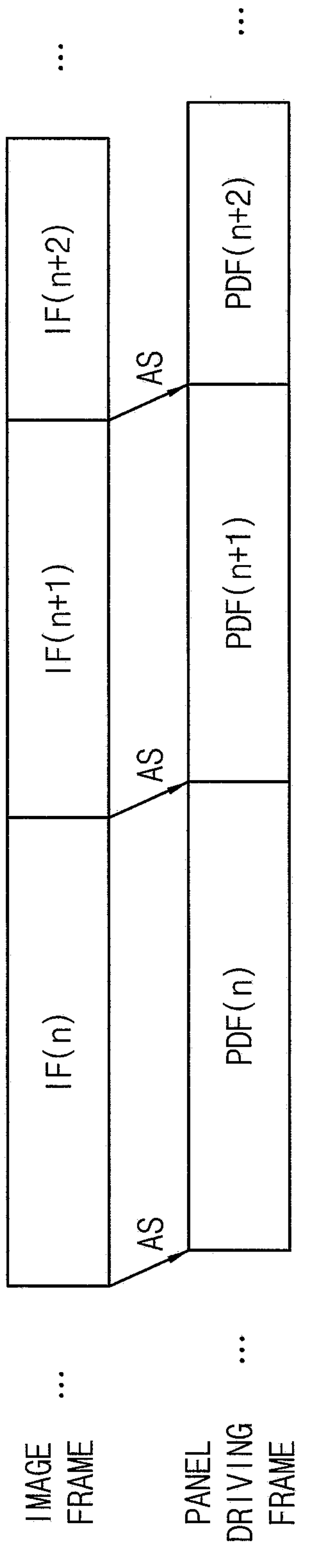
FIG. 7 is a diagram for describing the method of FIG. 6.
Figure 8:
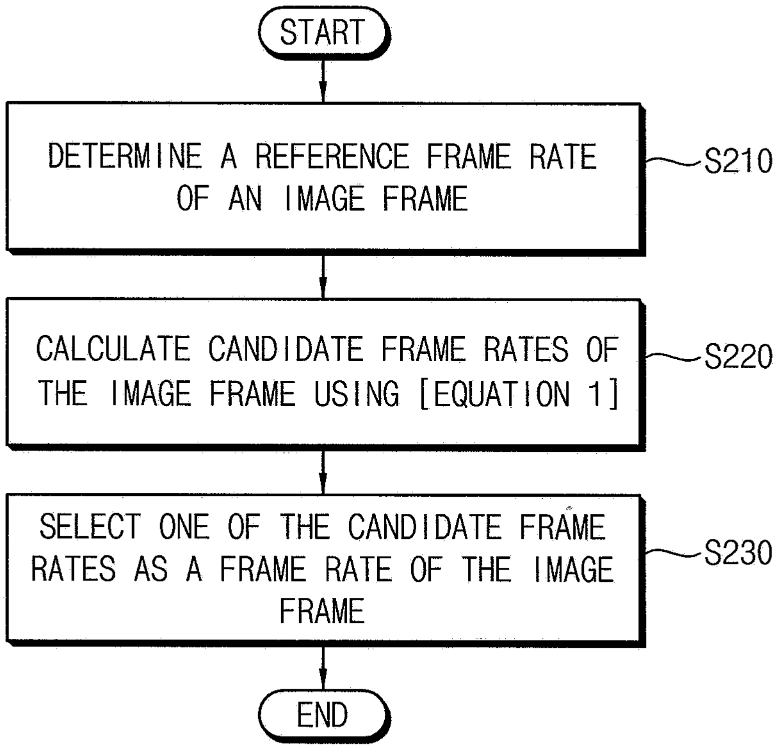
FIG. 8 is a flow chart illustrating an example in which a frame rate of an image frame is changed by the method of FIG. 6.

FIG. 6 is a flow chart illustrating a method of operating an organic light emitting display device according to some example embodiments. FIG. 7 is a diagram for describing the method of FIG. 6. FIG. 8 is a flow chart illustrating an example in which a frame rate of an image frame is changed by the method of FIG. 6.

Referring to FIGS. 6 to 8, the method of FIG. 6 may be applied to an organic light emitting display device that employs an impulse driving method by which an organic light emitting diode included in a pixel circuit emits light in response to an emission on-off clock. For example, the method of FIG. 6 may change a frame rate of an image frame IF(n), IF(n+1), and IF(n+2) composing image data, where n is an integer greater than or equal to 1, while a displaying operation is performed (S120), may change a frame rate of a panel driving frame PDF(n), PDF(n+1), and PDF(n+2) for the displaying operation (S140) as the frame rate of the image frame IF(n), IF(n+1), and IF(n+2) composing the image data is changed, and may apply the emission on-off clock to the panel driving frame PDF(n), PDF(n+1), and PDF(n+2) for the displaying operation to display images corresponding to the image data (S160). As illustrated in FIG. 7, the method of FIG. 6 may change the frame rate of the panel driving frame PDF(n), PDF(n+1), and PDF(n+2) while changing the frame rate of the image frame IF(n), IF(n+1), and IF(n+2) and may synchronize a driving timing of the panel driving frame PDF(n), PDF(n+1), and PDF(n+2) with a transmitting timing of the image frame IF(n), IF(n+1), and IF(n+2) (e.g., indicated by AS). Here, the method of FIG. 6 may change the frame rate of the image frame IF(n), IF(n+1), and IF(n+2) while satisfying the condition in which the emission duty ratio of the panel driving frame PDF(n), PDF(n+1), and PDF(n+2) is not changed. Thus, the method of FIG. 6 may prevent or reduce a flicker that a viewer can perceive from occurring by maintaining the emission duty ratio to be constant for each panel driving frame PDF(n), PDF(n+1), and PDF(n+2) when the frame rate of the panel driving frame PDF(n), PDF(n+1), and PDF(n+2) is changed as the frame rate of the image frame IF(n), IF(n+1), and IF(n+2) is changed and when the driving timing of the panel driving frame PDF(n), PDF(n+

1), and PDF(n+2) is synchronized with the transmitting timing of the image frame IF(n), IF(n+1), and IF(n+2) (e.g., indicated by AS).

In some example embodiments, one clock cycle time of the emission on-off clock may not be changed although the frame rate of the panel driving frame PDF(n), PDF(n+1), and PDF(n+2) is changed as the frame rate of the image frame IF(n), IF(n+1), and IF(n+2) is changed. In some example embodiments, the method of FIG. 6 may change the frame rate of the image frame IF(n), IF(n+1), and IF(n+2) to control the time of the image frame IF(n), IF(n+1), and IF(n+2) to be equal to or longer than one clock cycle time of the emission on-off clock EM. Here, the method of FIG. 6 may change the frame rate of the image frame IF(n), IF(n+1), and IF(n+2) to control the time of the image frame IF(n), IF(n+1), and IF(n+2) to be an integer multiple of one clock cycle time of the emission on-off clock EM. In some example embodiments, the method of FIG. 6 may change the frame rate of the image frame IF(n), IF(n+1), and IF(n+2) using the [Equation 1] to satisfy the condition in which the emission duty ratio of the panel driving frame PDF(n), PDF(n+1), and PDF(n+2) is not changed. For example, as illustrated in FIG. 8, the method of FIG. 6 may change the frame rate of the image frame IF(n), IF(n+1), and IF(n+2) by determining a reference frame rate of the image frame IF(n), IF(n+1), and IF(n+2) (S210), by calculating candidate frame rates of the image frame IF(n), IF(n+1), and IF(n+2) using the [Equation 1] (S220), and by selecting one of the candidate frame rates of the image frame IF(n), IF(n+1), and IF(n+2) as the frame rate of the image frame IF(n), IF(n+1), and IF(n+2) (S230). In some example embodiments, the method of FIG. 6 may increase the frame rate of the panel driving frame PDF(n), PDF(n+1), and PDF(n+2) as the frame rate of the image frame IF(n), IF(n+1), and IF(n+2) is increased and may decrease the frame rate of the panel driving frame PDF(n), PDF(n+1), and PDF(n+2) as the frame rate of the image frame IF(n), IF(n+1), and IF(n+2) is decreased. In some example embodiments, the method of FIG. 6 may change the frame rate of the panel driving frame PDF(n), PDF(n+1), and PDF(n+2) to be equal to the frame rate of the image frame IF(n), IF(n+1), and IF(n+2). As described above, the method of FIG. 6 may allow the organic light emitting display device, where the organic light emitting display device employs the impulse driving method by which the organic light emitting diode included in the pixel circuit emits light in response to the emission on-off clock, to provide a high-quality image to the viewer.

Figure 9:
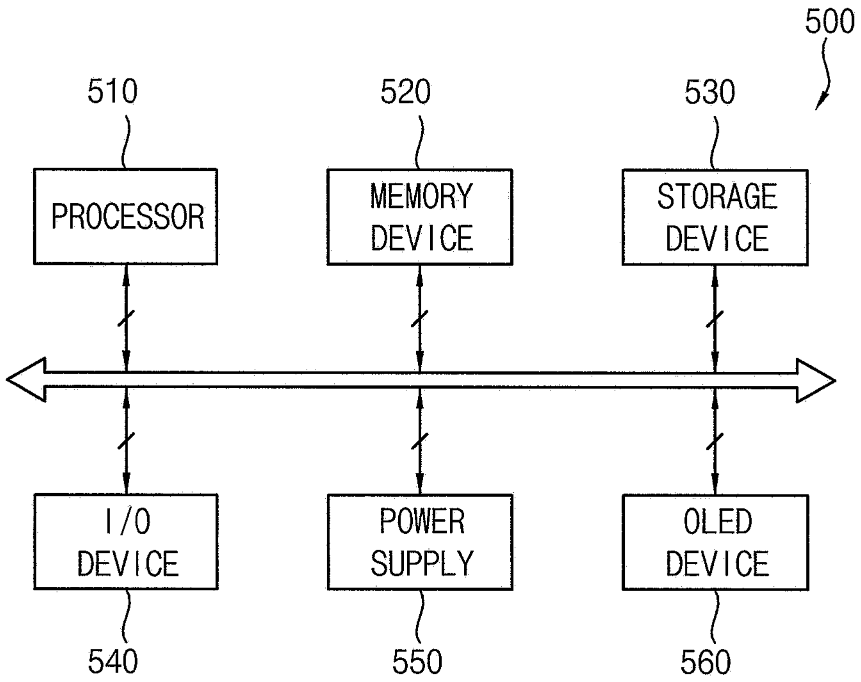
FIG. 9 is a block diagram illustrating an electronic device according to some example embodiments.
Figure 10:
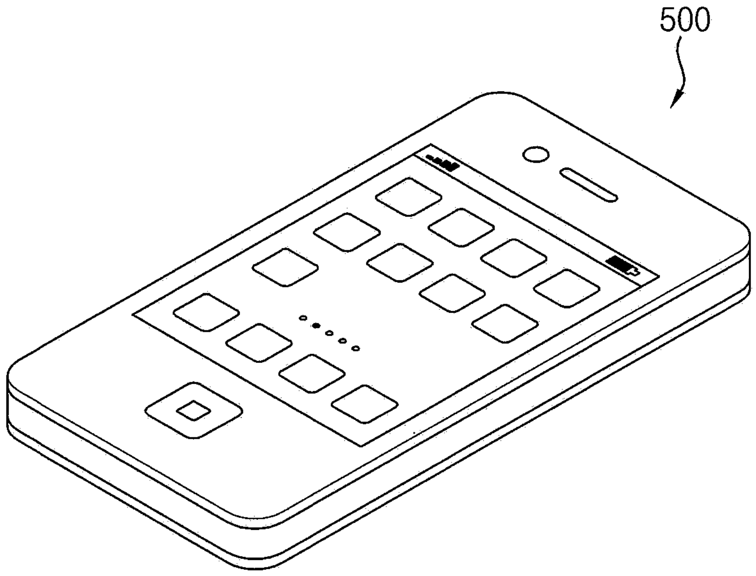
FIG. 10 is a diagram illustrating an example in which the electronic device of FIG. 9 is implemented as a smart phone.

FIG. 9 is a block diagram illustrating an electronic device according to some example embodiments. FIG. 10 is a diagram illustrating an example in which the electronic device of FIG. 9 is implemented as a smart phone.

Referring to FIGS. 9 and 10, the electronic device 500 may include a processor 510, a memory device 520, a storage device 530, an input/output (I/O) device 540, a power supply 550, and an organic light emitting display device 560. Here, the organic light emitting display device 560 may be the organic light emitting display device 100 of FIG. 1. In addition, the electronic device 500 may further include a plurality of ports for communicating with a video card, a sound card, a memory card, a universal serial bus (USB) device, other electronic devices, etc. In some example embodiments, as illustrated in FIG. 10, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a television, a computer monitor, a laptop, a head mounted display (HMD) device, etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile DRAM device, etc. The storage device 530 may be a solid state drive (SSD) device, a hard disk drive (HDD) device, a CD-ROM device, etc. The I/O device 540 may be an input device such as a keyboard, a keypad, a mouse device, a touchpad, a touch-screen, a remote controller, etc., and an output device such as a printer, a speaker, etc. In some example embodiments, the organic light emitting display device 560 may be included in the I/O device 540. The power supply 550 may provide power for operations of the electronic device 500.

The organic light emitting display device 560 may be coupled to other components via the buses or other communication links. For example, the organic light emitting display device 560 may include a source device and a sink device that perform data communication using a specific interface. The source device may output image data to the sink device. The sink device may receive the image data from the source device and may perform a displaying operation based on the image data. As described above, the organic light emitting display device 560 may employ an impulse driving method by which an organic light emitting diode included in a pixel circuit emits light in response to an emission on-off clock. In addition, the organic light emitting display device 560 may change a frame rate of an image frame composing the image data (or, a time of the image frame) in real time while performing the displaying operation to display images. Here, the organic light emitting display device 560 may prevent or reduce a flicker that a viewer can perceive from occurring by maintaining an emission duty ratio to be constant for each panel driving frame when a frame rate of the panel driving frame is changed as a frame rate of the image frame is changed and when a driving timing of the panel driving frame for the displaying operation is synchronized with a transmitting timing of the image frame. Thus, the organic light emitting display device 560 may provide a high-quality image to the viewer. To this end, the source device may change the frame rate of the image frame while satisfying a condition in which the emission duty ratio of the panel driving frame is not changed. In some example embodiments, the source device may change the frame rate of the image frame using the [Equation 1]. Here, one clock cycle time of the emission on-off clock may not be changed although the frame rate of the panel driving frame is changed as the frame rate of the image frame is changed. In some example embodiments, the sink device may change the frame rate of the panel driving frame to have the same value as the frame rate of the image frame when the source device changes the frame rate of the image frame while satisfying the condition in which the emission duty ratio of the panel driving frame is not changed. Because the organic light emitting display device 560 is described above, duplicated description related thereto will not be repeated.

The present invention may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The present inventive concept may be applied to an organic light emitting display device and an electronic device including the organic light emitting display device.

For example, the present inventive concept may be applied to a cellular phone, a smart phone, a video phone, a smart pad, a smart watch, a tablet PC, a car navigation system, a television, a computer monitor, a laptop, a digital camera, an HMD device, etc.

The foregoing is illustrative of some example embodiments and is not to be construed as limiting thereof. Although some example embodiments have been described, those skilled in the art will readily appreciate that many modifications are possible in the example embodiments without materially departing from the novel teachings and characteristics of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims, and their equivalents.

What is claimed is:

1. A method of operating an organic light emitting display device in which an organic light emitting diode included in a pixel circuit emits light in response to an emission on-off clock, the method comprising:

changing, while a displaying operation is performed, a frame rate of an image frame composing image data while satisfying a condition in which an emission duty ratio of a panel driving frame for the displaying operation is not changed; and changing a frame rate of the panel driving frame as the frame rate of the image frame is changed such that a driving timing of the panel driving frame is synchronized with a transmission timing of the image frame.

2. The method of claim 1, further comprising:

applying the emission on-off clock to the panel driving frame to display images corresponding to the image data.

3. The method of claim 2, wherein one clock cycle time of the emission on-off clock is not changed when the frame rate of the image frame and the frame rate of the panel driving frame are changed.

4. The method of claim 3, wherein the frame rate of the image frame is changed to control a time of the image frame to be equal to or longer than the one clock cycle time of the emission on-off clock.

5. The method of claim 4, wherein the frame rate of the image frame is changed to control the time of the image frame to be an integer multiple of the one clock cycle time of the emission on-off clock.

6. The method of claim 3, wherein the frame rate of the panel driving frame is increased as the frame rate of the image frame is increased, and wherein the frame rate of the panel driving frame is decreased as the frame rate of the image frame is decreased.

7. The method of claim 6, wherein the frame rate of the panel driving frame is changed to be equal to the frame rate of the image frame.

8. The method of claim 3, wherein the frame rate of the image frame is changed according to characteristics of images that are displayed by the displaying operation.

9. The method of claim 8, wherein the frame rate of the image frame is increased when a change of the images is faster than a predetermined reference speed.

10. The method of claim 8, wherein the frame rate of the image frame is decreased when a change of the images is slower than a predetermined reference speed.

11. A method of operating an organic light emitting display device in which an organic light emitting diode included in a pixel circuit emits light in response to an emission on-off clock, the method comprising: changing a frame rate of an image frame composing image data while a displaying operation is performed; and changing a frame rate of a panel driving frame for the displaying operation as the frame rate of the image frame is changed such that a driving timing of the panel driving frame is synchronized with a transmission timing of the image frame, wherein the frame rate of the image frame is changed using [Equation 1] as follows:

$$F = \frac{1}{A \times K}$$

where F denotes the frame rate of the image frame, A denotes one clock cycle time of the emission on-off clock, and K is an integer greater than or equal to 1.

12. The method of claim 11, wherein the frame rate of the image frame is changed by selecting one of a plurality of candidate frame rates of the image frame that are calculated by the [Equation 1] as the frame rate of the image frame.

13. The method of claim 11, further comprising:

applying the emission on-off clock to the panel driving frame to display images corresponding to the image data.

14. The method of claim 13, wherein the one clock cycle time of the emission on-off clock is not changed when the frame rate of the image frame and the frame rate of the panel driving frame are changed.

15. The method of claim 14, wherein an emission duty ratio of the panel driving frame is not changed even when the frame rate of the panel driving frame is changed.

16. The method of claim 14, wherein the frame rate of the panel driving frame is increased as the frame rate of the image frame is increased, and wherein the frame rate of the panel driving frame is decreased as the frame rate of the image frame is decreased.

17. The method of claim 16, wherein the frame rate of the panel driving frame is changed to be equal to the frame rate of the image frame.

18. The method of claim 14, wherein the frame rate of the image frame is changed according to characteristics of images that are displayed by the displaying operation.

19. The method of claim 18, wherein the frame rate of the image frame is increased when a change of the images is faster than a predetermined reference speed.

20. The method of claim 18, wherein the frame rate of the image frame is decreased when a change of the images is slower than a predetermined reference speed.

* * * * *